United States Patent
Hyde et al.

(10) Patent No.: US 7,435,514 B2
(45) Date of Patent: Oct. 14, 2008

(54) ACTIVE MASK LITHOGRAPHY

(75) Inventors: Roderick A. Hyde, Livermore, CA (US); Nathan P. Myhrvold, Medina, WA (US)

(73) Assignee: Searete LLC, Bellevue, WA (US)

( * ) Notice: Subject to any disclaimer, the term of this patent is extended or adjusted under 35 U.S.C. 154(b) by 340 days.

(21) Appl. No.: 11/413,958

(22) Filed: Apr. 27, 2006

(65) Prior Publication Data

US 2006/0264016 A1  Nov. 23, 2006

Related U.S. Application Data

(63) Continuation-in-part of application No. 11/132,736, filed on May 19, 2005.

(51) Int. Cl.
  *G03F 1/00* (2006.01)
  *G03C 5/00* (2006.01)
  *H01L 21/22* (2006.01)

(52) U.S. Cl. ............... 430/5; 430/313; 430/311; 438/542; 438/5; 700/121

(58) Field of Classification Search ............ 430/5, 430/311, 313; 438/5, 542; 700/121
See application file for complete search history.

(56) References Cited

U.S. PATENT DOCUMENTS

| | | | |
|---|---|---|---|
| 6,365,326 B1 * | 4/2002 | Surendra et al. | 430/313 |
| 6,433,465 B1 | 8/2002 | McKnight et al. | |
| 6,521,383 B2 * | 2/2003 | Surendra et al. | 430/5 |
| 6,543,110 B1 | 4/2003 | Pelrine et al. | |
| 6,586,859 B2 | 7/2003 | Kornbluh et al. | |
| 6,681,849 B2 | 1/2004 | Goodson, Jr. | |
| 6,696,220 B2 | 2/2004 | Bailey et al. | |
| 6,753,131 B1 | 6/2004 | Rogers et al. | |
| 6,781,284 B1 | 8/2004 | Pelrine et al. | |
| 6,806,621 B2 | 10/2004 | Heim et al. | |
| 6,809,462 B2 | 10/2004 | Pelrine et al. | |
| 2003/0080442 A1 | 5/2003 | Unger | |
| 2003/0141473 A1 | 7/2003 | Pelrine et al. | |
| 2006/0264015 A1 * | 11/2006 | Hyde et al. | 438/542 |

OTHER PUBLICATIONS

Bar-Cohen, Yoseph; "Electroactive Polymers as Artificial Muscles—Reality and Challenges"; Proceedings of the 42nd AIAA Structures, Structural Dynamics, and Materials Conference (SDM), Gossamer Spacecraft Forum (GSF); bearing dates of Apr. 16-19, 2001; pp. 1-10; Paper #2001-1492; Seattle, Washington; located at http://ndeaa.jpl.nasa.gov/ndeaa-pub/AIAA/AIAA-EAP-review-2001.pdf.

Bermudez, H.; Aranada-Espinoza, H.; Hammer, D.A.; Discher, D.E.; "Pore Stability and Dynamics in Polymer Membranes"; bearing a date of Nov. 22, 2002; pp. 1-4.

Bier, Martin; Gowrishankar, T.R.; Chen, Wei; Lee, Raphael C.; "Electroporation of a Lipid Bilayer as a Chemical Reaction"; Bioelectromagnetics bearing a date of 2004; pp. 634-637; vol. 25.

(Continued)

*Primary Examiner*—Nikita Wells

(57) ABSTRACT

An active mask emits a patterned energy flux in response to an energy input.

55 Claims, 2 Drawing Sheets

OTHER PUBLICATIONS

Cohen, J.Y.; "Electroactive Polymers as Artificial Muscles—A Primer"; bearing dates of 2003 and Nov. 9, 2004; pp. 1-14; located at http://polysep.ucla.edu/Research%20Advances/EAP/electroactive_polymers_as_artifi.htm; printed on Apr. 15, 2005.

Kik, Pieter G.; Martin, Andrea L.; Maier, Stefan A.; Atwater, Harry A.; "Metal nanoparticle arrays for near field optical lithography"; SPIE Proceedings (2002); pp. 1-7; located at http://kik.creol.ucf.edu/publications/2002-kik-spie.pdf.

Kik, Pieter G.; Maier, Stefan A.; Atwater, Harry A.; "Plasmon printing—a new approach to near-field lithography"; Mat. Res. Soc. Symp. Proc. 705, Y3.6 (2002); pp. 1-6; located at http://kik.creol.ucf.edu/publications/2002-kik-mrs.pdf.

Moroz, David J.; Nelson, Philip; "Dynamically-Stabilized Pores in Bilayer Membranes"; bearing dates of Sep. 1996 and May 14, 1997; pp. 1-7.

Luo, Xiangang; Ishihara, Teruya; "Surface plasmon resonant interference nanolithography technique"; Applied Physics Letters; Jun. 7, 2004; pp. 1-3; vol. 84, No. 23.

Tsong, Tian Y.; "Electroporation of cell membranes"; Biophysics Journal; bearing a date of Aug. 1991; pp. 297-306; vol. 60; Biophysical Society.

Xia, Younan; Whitesides, George M.; "Soft Lithography"; Annual Review Material Science; bearing a date of 1998; pp. 153-184; vol. 28:153-84; located at http://web.mit.edu/10.491/softlithographyreview.pdf.

U.S. Appl. No. 11/580,526, Hyde et al.

* cited by examiner

ACTIVE MASK LITHOGRAPHY

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

Related Applications:

For purposes of the USPTO extra-statutory requirements, the present application constitutes a continuation-in-part of currently co-pending U.S. patent application Ser. No. 11/132,736, entitled ELECTROACTIVE POLYMERS FOR LITHOGRAPHY, naming RODERICK A. HYDE and NATHAN P. MYHRVOLD as inventors, filed May 19, 2005, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. The present applicant entity has provided above a specific reference to the application(s) from which priority is being claimed as recited by statute. Applicant entity understands that the statute is unambiguous in its specific reference language and does not require either a serial number or any characterization, such as "continuation" or "continuation-in-part," for claiming priority to U.S. patent applications. Notwithstanding the foregoing, applicant entity understands that the USPTO's computer programs have certain data entry requirements, and hence applicant entity is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

BACKGROUND

Currently, lithography is the most complicated and expensive process in mainstream microelectronic fabrication. As required chip feature sizes grow ever smaller, lithography techniques are continually updated to achieve the desired resolution. Projection lithography systems may be limited in resolution due to limitations in depth of field for high numerical aperture optics. For certain types of lithography, greater resolution may be achievable using contact methods, in which a mask is placed in contact with a substrate.

SUMMARY

In one aspect, a lithographic mask includes a patterned energy emitting layer. The layer includes at least one active region that emits an energy flux at a selected level in response to an electrical input, and at least one inactive region that does not emit an energy flux at the selected level in response to the electrical input. The emitted energy flux may be electromagnetic radiation, electrons, an evanescent wave, and/or an electromagnetic field, the effective portion of which may be substantially static or dynamic, and may be substantially purely electric or magnetic. The patterned energy emitting layer may include a light emitting diode and/or an electrode.

In another aspect, a lithographic mask includes a patterned energy emitting layer. The layer includes at least one active region that emits an energy flux at a selected level in response to an optical input, and at least one inactive region that does not emit an energy flux at the selected level in response to the optical input. The optical input has an input frequency, and the energy flux has an output frequency that is less than the input frequency. The energy flux may be electromagnetic radiation, an electric field, and/or a magnetic field. The patterned energy emitting layer may comprise a fluorescent material (e.g., a phosphor, a quantum dot, and/or a photonic crystal), and the emitted energy may be emitted by fluorescence of the fluorescent material.

In yet another aspect, a lithographic apparatus includes a patterned energy emitting layer and a substrate support. The layer includes at least one active region that emits an energy flux, and at least one inactive region that does not emit an energy flux. The substrate support is arranged to hold a substrate in a position to receive the energy flux. The apparatus may also include a beam-directing element that directs the energy flux towards the substrate. The emitted energy flux may be electromagnetic radiation, electrons, an evanescent wave, and/or an electromagnetic field, which may be static or dynamic, and may be purely electric or magnetic. The patterned energy emitting layer may include a light emitting diode, a fluorescent material, and/or an electrode, and may further include an input configured to trigger emission of the energy flux. The input may be configured to trigger emission in response to an optical or electrical signal.

In still another aspect, a lithographic method includes generating an energy flux and exposing a flux sensitive material to the generated energy flux at a level selected to modify the flux sensitive material. The energy flux is generated by activating a patterned energy emitting layer. The layer includes at least one active region that emits an energy flux, and at least one inactive region that does not emit an energy flux. The emitted energy flux may be electromagnetic radiation, electrons, an evanescent wave, and/or an electromagnetic field, the effective portion of which may be static or dynamic, and may be substantially purely electric or magnetic. Activating the patterned energy emitting layer may include activating one or more light emitting diodes. The patterned energy emitting layer may include a fluorescent material, which may fluoresce upon activation of the patterned energy emitting layer. This fluorescence may be induced by exposure to electromagnetic radiation, or by application of an electric field. The patterned energy emitting layer may include an electrode, and activation of the layer may include applying a voltage to the electrode. The electrode may be in contact with the substrate during application of the voltage. The flux sensitive material may comprise a lipid bilayer, and exposing the flux sensitive material may include forming pores in the lipid bilayer. The method may further include applying an etchant to the lipid bilayer after the pores have formed. The flux sensitive material may include a resist coating, and exposing the flux sensitive material may include inducing a chemical change in the resist coating. The exposed flux sensitive material may be modified in a pattern corresponding to the pattern of the patterned energy emitting layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
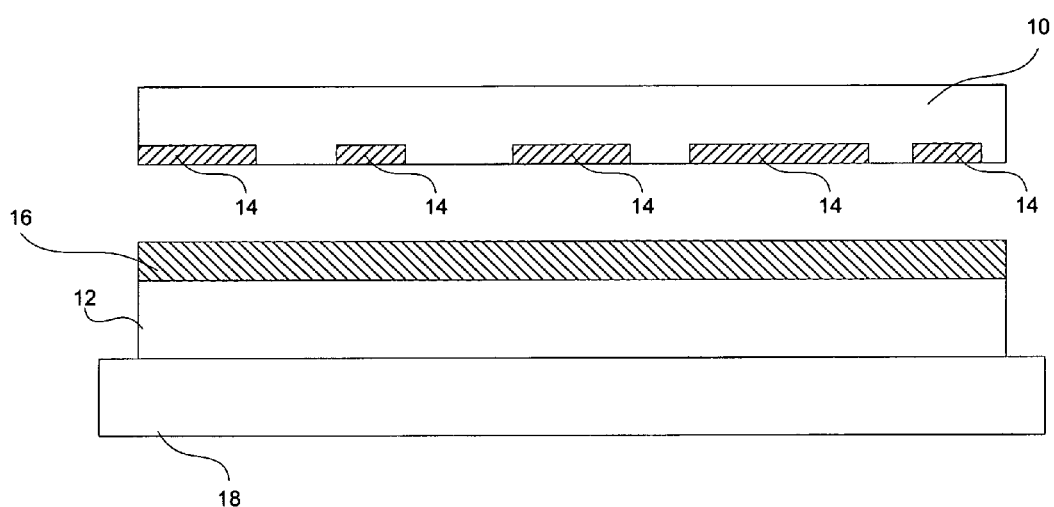
FIG. 1 is a schematic of one embodiment of an active mask and substrate.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Most modern lithographic systems use photomasks to expose substrates. The photomasks are generally passive devices that serve to block radiation in selected areas, thereby producing a pattern on a resist surface. Rather than simply acting to block external radiation, the present active masks themselves generate electromagnetic radiation or other outputs to expose a photoresist or otherwise interact with a substrate.

FIG. 1 is a schematic of one embodiment of an active mask 10 and substrate 12. The mask 10 comprises a plurality of active regions 14. When activated, the active regions 14 act to expose a resist layer 16 on the substrate 12. The resist layer 16 (which may be either a positive or negative resist) may then be developed using lithographic techniques. In other embodiments, the resist may be absent, and the active regions may interact directly with the substrate material. The substrate 12 may be supported by a substrate support 18.

Figure 2:
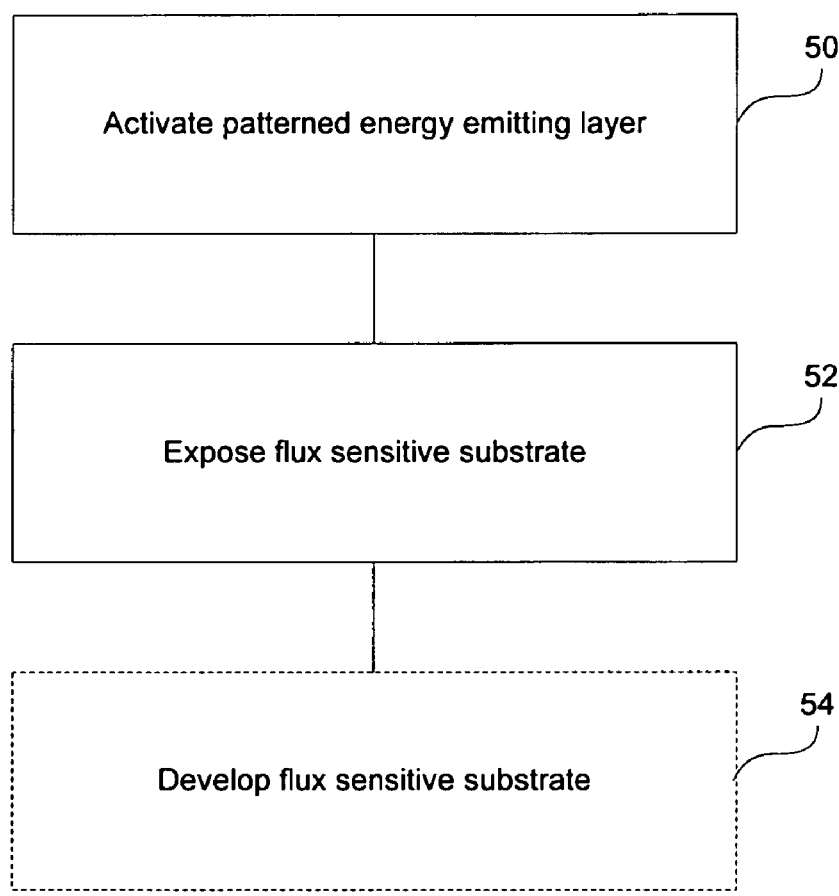
FIG. 2 is a flow chart describing one method of use of an active mask.

FIG. 2 is a flow chart describing one method of use of an active mask. The patterned energy emitting layer (which includes at least one active region and at least one inactive region) is activated 50 to generate an energy flux (e.g., an electromagnetic field, photons, or particles such as electrons). A flux sensitive substrate (e.g., a substrate coated with a resist composition or a lipid bilayer) is then exposed 52 to the energy flux at a level selected to modify the flux sensitive substrate. Optionally, the exposed substrate may be developed 54 after exposure (e.g., by etching a lipid bilayer, or by selectively removing resist from either the exposed or the unexposed area).

The active regions may take many forms. In some embodiments, the active regions generate electromagnetic radiation. For example, in some embodiments, the active regions may be light-emitting diodes that emit light in response to an electrical input, or they may include phosphors, photonic crystals, or fluorescent materials that emit light in response to an input of electromagnetic radiation. In some of these embodiments, such re-emitted light is at a lower frequency than the input light.

In other embodiments, the active regions may also produce static or dynamic magnetic, electric, or electromagnetic fields in response to an energy input (e.g., an applied voltage), or they may emit electrons or other particles.

Traditional masks typically have a fixed pattern of transmissive regions. Active masks may similarly have a fixed pattern of active regions, so that each exposed substrate is patterned according to the fixed pattern. Alternatively, the masks may be dynamic in nature. In some embodiments, the output of the masks may be controlled by controlling the input. For example, a mask that is activated by an applied voltage may have a plurality of regions that may be selectively activated depending on which of a number of voltage inputs are applied. A mask that is responsive to an optical input may also be activated by a selectively applied input. In other embodiments, the masks may be configured so that the active regions themselves change size, shape, or configuration. For example, a selectively actuatable electroactive polymer, such as those described in copending and commonly owned U.S. patent application Ser. No. 11/132,736, filed May 19, 2005 and incorporated herein by reference, may be used to change the configuration of an active mask. In some embodiments, this may be achieved by selectively bringing portions of the active mask into closer proximity to a substrate, thereby allowing them to expose the substrate.

Various beam-shaping, splitting, filtering, polarizing, or other interactive elements (collectively, "beam-directing" elements) may be used in conjunction with the active mask. For example, when the input energy comprises an optical input, traditional optical elements such as mirrors, diffractive elements, refractive elements, lenses, or any other optical elements appropriate for the configuration may be used to direct the input energy toward the active mask. Similarly, when the active mask emits an optical output, such optical elements may be used to direct the output from the mask to the substrate. "Optical element," as used herein, is intended to include all elements suitable for changing the direction, focus, polarization, or other properties of an optical energy flux. When an input or output comprises an electric field, strategically placed conductors, dielectrics, metamaterials, and/or active components may be arranged to shape the electric field in an analogous fashion. Similarly, such elements or static or dynamic electromagnetic fields may direct beams of charged particles. Those of skill in the art will recognize that a variety of methods for directing energy are available and that various methods are appropriate in particular embodiments depending on the specifics of the mask input and output, substrate, and resist (if any).

In some embodiments, the active mask will be used for contact lithography and/or for proximity printing. In proximity lithography systems, distances between mask and substrate are currently often in the range of about 5 μm to about 100 μm, or of about 10 μm to about 50 μm, but shorter or longer offsets are also contemplated, including effectively zero distances in the case of contact lithography. In particular, since diffraction effects in proximity systems are minimized when offsets are small, it is contemplated that distances between mask and substrate may be as low as about 1 μm, 100 nm, or even 10 nm.

Potential resist materials include traditional photoresists, but also may include materials that have a physical and/or chemical change in the presence of energy inputs, such as lipid bilayers that electroporate in the presence of an electric field. Such bilayers are described, for example, in Bier, et al., "Electroporation of a Lipid Bilayer as a Chemical Reaction," *Bioelectromag.* 25:634-637 (2004), which is incorporated herein by reference. Exposure to an electric field above a minimum field strength causes pores to open (either reversibly or irreversibly, depending on the exposure characteristics). Pores may, for example, admit etchants to the underlying substrate, or as initiation points to selectively remove the lipid bilayer by chemical or other attack. Other materials that undergo a physical and/or chemical change in response to the output of the active mask may also be used as resists (e.g., materials that may be ablated by application of an electron beam may be used in conjunction with an active mask that emits electrons).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A lithographic mask, comprising:
   a patterned energy emitting layer, the layer comprising
   at least one active region that emits an energy flux at a selected level in response to an electrical input; and
   at least one inactive region that does not emit an energy flux at the selected level in response to the electrical input.
2. The mask of claim 1, wherein the energy flux is electromagnetic radiation.
3. The mask of claim 1, wherein the energy flux is electrons.
4. The mask of claim 1, wherein the energy flux is an evanescent wave.
5. The mask of claim 1, wherein the energy flux is an electromagnetic field.
6. The mask of claim 5, wherein the electromagnetic field is static.
7. The mask of claim 5, wherein the electromagnetic field is dynamic.
8. The mask of claim 5, wherein the electromagnetic field is purely electric.
9. The mask of claim 5, wherein the electromagnetic field is purely magnetic.
10. The mask of claim 1, wherein the patterned energy emitting layer comprises a light emitting diode.
11. The mask of claim 1, wherein the patterned energy emitting layer comprises an electrode.
12. A lithographic mask, comprising:
    a patterned energy emitting layer, the layer comprising
    at least one active region that emits an energy flux at a selected level in response to an optical input having an input frequency, wherein the energy flux has an output frequency that is not greater than the input frequency; and
    at least one inactive region that does not emit an energy flux at the selected level in response to the optical input.
13. The mask of claim 12, wherein the energy flux is electromagnetic radiation.
14. The mask of claim 12, wherein the energy flux is an electromagnetic field.
15. The mask of claim 12, wherein the patterned energy emitting layer comprises a fluorescent material, and wherein the energy flux is emitted by fluorescence of the fluorescent material.
16. The mask of claim 15, wherein the fluorescent material comprises a phosphor.
17. The mask of claim 15, wherein the fluorescent material comprises a quantum dot.
18. The mask of claim 15, wherein the fluorescent material comprises a nonlinear optical material.
19. A lithographic apparatus, comprising:
    a patterned energy emitting layer, the layer comprising at least one active region that emits an energy flux and at least one inactive region that does not emit an energy flux; and
    a substrate support arranged to hold a substrate in a position to receive the energy flux.
20. The apparatus of claim 19, further comprising a beam-directing element that directs the energy flux toward the substrate.
21. The apparatus of claim 19, wherein the energy flux is electromagnetic radiation.
22. The apparatus of claim 19, wherein the energy flux is electrons.
23. The apparatus of claim 19, wherein the energy flux is an evanescent wave.
24. The apparatus of claim 19, wherein the energy flux is an electromagnetic field.
25. The apparatus of claim 24, wherein the electromagnetic field is static.
26. The apparatus of claim 24, wherein the electromagnetic field is dynamic.
27. The apparatus of claim 24, wherein the electromagnetic field is purely electric.
28. The apparatus of claim 24, wherein the electromagnetic field is purely magnetic.
29. The apparatus of claim 19, wherein the patterned energy emitting layer comprises a light emitting diode.
30. The apparatus of claim 19, wherein the patterned energy emitting layer comprises a fluorescent material.
31. The apparatus of claim 19, wherein the patterned energy emitting layer comprises an electrode.
32. The apparatus of claim 19, wherein the patterned energy emitting layer comprises an input configured to trigger emission of the energy flux.
33. The apparatus of claim 32, wherein the input is configured to trigger emission in response to an optical signal.
34. The apparatus of claim 32, wherein the input is configured to trigger emission in response to an electrical signal.
35. A lithographic method, comprising:
    generating an energy flux by activating a patterned energy emitting layer, wherein the layer comprises at least one active region that emits an energy flux and at least one inactive region that does not emit an energy flux; and
    exposing a flux sensitive material to the generated energy flux at a level selected to modify the flux sensitive material.
36. The lithographic method of claim 35, wherein the generated energy flux is electromagnetic radiation.
37. The lithographic method of claim 35, wherein the generated energy flux is electrons.
38. The lithographic method of claim 35, wherein the generated energy flux is an evanescent wave.
39. The lithographic method of claim 35, wherein generating an energy flux by activating a patterned energy emitting layer includes generating an electromagnetic field.
40. The lithographic method of claim 39, wherein the generating an electromagnetic field includes generating a static electromagnetic field.
41. The lithographic method of claim 39, wherein generating an electromagnetic field includes generating a dynamic electromagnetic field.
42. The lithographic method of claim 39, wherein generating an electromagnetic field includes generating substantially only an electric field.
43. The lithographic method of claim 39, wherein generating an electromagnetic field includes generating substantially only a magnetic field.

44. The lithographic method of claim 35, wherein activating a patterned energy emitting layer comprises activating one or more light-emitting diodes.

45. The lithographic method of claim 35, wherein the patterned energy emitting layer comprises a fluorescent material.

46. The lithographic method of claim 45, wherein activating the patterned energy emitting layer comprises inducing fluorescence in the fluorescent material.

47. The lithographic method of claim 46, wherein inducing fluorescence in the fluorescent material comprises exposing the fluorescent material to electromagnetic radiation.

48. The lithographic method of claim 46, wherein inducing fluorescence in the fluorescent material comprises applying an electric field to the fluorescent material.

49. The lithographic method of claim 35, wherein the patterned energy emitting layer comprises an electrode.

50. The lithographic method of claim 49, wherein activating the patterned energy emitting layer comprises applying a voltage to the electrode.

51. The lithographic method of claim 50, wherein the electrode is in contact with the substrate during application of the voltage.

52. The lithographic method of claim 50, wherein the flux sensitive material includes a lipid bilayer, and wherein exposing the flux sensitive material to the generated energy flux includes forming pores in the lipid bilayer.

53. The lithographic method of claim 52, further comprising applying an etchant to the lipid bilayer after forming the pores.

54. The lithographic method of claim 35, wherein the flux sensitive material comprises a resist coating, and wherein exposing the flux sensitive material to the generated energy flux includes inducing a chemical change in the resist coating.

55. The lithographic method of claim 35, wherein the exposed flux sensitive material is modified in a pattern corresponding to the pattern of the patterned energy emitting layer.

* * * * *